United States Patent
Koburger, III et al.

(10) Patent No.: US 8,124,525 B1
(45) Date of Patent: Feb. 28, 2012

(54) METHOD OF FORMING SELF-ALIGNED LOCAL INTERCONNECT AND STRUCTURE FORMED THEREBY

(75) Inventors: Charles W. Koburger, III, Albany, NY (US); David V. Horak, Albany, NY (US); Shom Pomoth, Albany, NY (US); Chih-Chao Yang, Albany, NY (US); Su Chen Fan, Albany, NY (US); Sivananda K. Kanakasabapathy, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/913,143

(22) Filed: Oct. 27, 2010

(51) Int. Cl.
 *H01L 21/4763* (2006.01)
(52) U.S. Cl. .................. 438/631; 257/E21.583
(58) Field of Classification Search .......... 438/631; 257/E21.583
See application file for complete search history.

(56) References Cited

U.S. PATENT DOCUMENTS

| | | | |
|---|---|---|---|
| 4,692,205 A | 9/1987 | Sachdev et al. | |
| 6,027,997 A | 2/2000 | Yu et al. | |
| 6,100,195 A | 8/2000 | Chan et al. | |
| 6,127,262 A | 10/2000 | Huang et al. | |
| 6,451,698 B1 | 9/2002 | Au et al. | |
| 6,468,906 B1 | 10/2002 | Chan et al. | |
| 7,279,419 B2 * | 10/2007 | Kim et al. | 438/668 |
| 7,892,900 B2 * | 2/2011 | Liu et al. | 438/154 |
| 2009/0023289 A1 | 1/2009 | Hung et al. | |

* cited by examiner

*Primary Examiner* — William D Coleman
(74) *Attorney, Agent, or Firm* — Yuanmin Cai

(57) ABSTRACT

Embodiments of the present invention provide a method of forming local interconnect for semiconductor devices. The method includes depositing a blanket layer of conductive material over one or more semiconductor devices; creating a pattern of local interconnect covering a portion of the blanket layer of conductive material; removing rest of the blanket layer of conductive material that is not covered by the pattern of local interconnect; forming the local interconnect by the portion of the blanket layer of conductive material to connect the one or more semiconductor devices.

25 Claims, 15 Drawing Sheets

METHOD OF FORMING SELF-ALIGNED LOCAL INTERCONNECT AND STRUCTURE FORMED THEREBY

FIELD OF THE INVENTION

The present invention relates generally to the field of semiconductor device manufacturing and in particular relates to method of forming self-aligned local interconnect and structure formed thereby.

BACKGROUND OF THE INVENTION

State of art procedure of forming contacts and/or local interconnects for semiconductor devices, such as field-effect-transistors, generally involves steps of depositing and then planarizing an insulating pre-metal dielectric ("PMD") layer on top of the semiconductor devices; forming one or more contact and/or local interconnect masks on top of the PMD layer to create a pattern of holes or openings inside the PMD layer; and damascening conductive material into the holes or openings in the PMD layer to form the contacts (CAs) and/or local interconnects (LIs).

For many generations, and in particular as dimensions of structures being contacted shrink below 100 nm, process control of the above "contact hole etching" approach is becoming increasingly difficult and problematic. For example, process issues were observed relating to: 1) erosion of gate sidewall films and/or spacers which are normally made of nitride; and 2) erosion of substrate/silicide at the bottom of CA/LI holes. Gate sidewall films are used to protect the gate from shorting to the CA/LI, and so erosion of these films may cause decrease in device yield and increase in leakage current when image size and overlay conspire to overlap the CA/LI with the gate. Similarly, substrate/silicide erosion may cause leakage as well. Moreover, because rate of blanket etching used in the process is generally very high, it is very difficult to achieve zero-to-tiny erosion in very small spaces. During a lithographic process, features must be printed larger than their desired final dimensions in order to guarantee image quality, and subsequently the printed features must be shrunk during etching processes. Controlling of this shrinkage process is becoming a major challenge for increasingly-small holes with variability over a larger portion of the overall image size. It is difficult to avoid the above problems through feature size/placement control.

One approach to address above problems is to add an etch-stop layer underneath the PMD layer. Liners made of nitride were originally used for this purpose. However, the required thickness of nitride is filling gate-to-gate space quickly, at dimensions that are comparable to those common for 22 nm, and beyond, nodes. As a result, increased nitride over-etching as part of the CA/LI formation process is often required. Other approaches to address above problems may include using other types of etch-stop layers such as $HfSiO_x$ which has different property from nitride. However, the use of $HfSiO_x$ may add unwanted capacitance (since the dielectric constant of $HfSiO_x$ is very high) to the device in addition to that the process of removing $HfSiO_x$ after PMD etch has yet to be demonstrated as reliable.

SUMMARY OF EMBODIMENTS OF THE INVENTION

Embodiments of the present invention provide a method of forming local interconnect, in particular self-aligned local interconnect. More specifically, the method includes steps of depositing a blanket layer of conductive material over one or more semiconductor devices; creating a pattern of local interconnect covering a portion of the blanket layer of conductive material; removing rest of the blanket layer of conductive material that is not covered by the pattern of local interconnect; and forming local interconnect by the covered portion of the blanket layer of conductive material, with the local interconnect connecting the one or more semiconductor devices.

In one embodiment, the semiconductor devices are field-effect-transistors having source/drain regions and gate electrode and spacers adjacent to the gate electrode, and the method further includes depositing an insulating cap layer on top of the gate electrode, and forming silicide in the source/drain regions, of at least one of the one or more field-effect-transistors.

In one embodiment, depositing the blanket layer of conductive material includes depositing the blanket layer of conductive material directly on top of the spacers and silicide in the source/drain regions of the at least one of the one or more field-effect-transistors. In another embodiment, creating the pattern of local interconnect includes forming the pattern of local interconnect, in position relative to the cap layer, in a photo-resist material through a photo-lithographic process.

According to one embodiment, the method further includes, before forming the pattern of local interconnect in the photo-resist material, polishing the blanket layer of conductive material until the cap layer is exposed.

In one embodiment, the blanket layer of conductive material includes a layer of first conductive material being formed directly on top of a layer of second conductive material, the first conductive material being different from, and having at least equal or less resistance than, the second conductive material. For example, the first conductive material may be tungsten (W) and the second conductive material may be aluminum (Al), with the layer of second conductive material lining the one or more semiconductor devices. In another embodiment, removing the rest of the blanket layer of conductive material includes applying a first selective etching process to remove the first conductive material and a second selective etching process to remove the second conductive material, the second selective etching process has a better selectivity, relative to the one or more semiconductor devices, than the first selective etching process.

According to one embodiment, the method further includes removing the spacers of the one or more field-effect-transistors after forming the local interconnect, thereby creating openings between the local interconnect and the gate electrodes. In one embodiment, the method further includes depositing a dielectric layer covering the local interconnect, wherein depositing the dielectric layer fills only partially the openings between the local interconnect and the gate electrodes and does not entirely close the openings. In another embodiment, the method further includes planarizing the dielectric layer and forming at least one metal contact on top thereof, wherein the at least one metal contact is in contact with the local interconnect.

According to another embodiment of the present invention, a local interconnect structure for semiconductor devices such as field-effect-transistors is provided. The structure includes interconnects that are self-aligned to spacers of the field-effect-transistors without border. In one embodiment, spacers of the field-effect-transistors are removed after CA/LI formation, leaving air gaps or tunnels between gate electrode of the field-effect-transistor and the local interconnects.

BRIEF DESCRIPTION OF THE DRAWINGS

The present invention will be understood and appreciated more fully from the following detailed description of preferred embodiments, taken in conjunction with the accompanying drawings of which.

Figure 1:
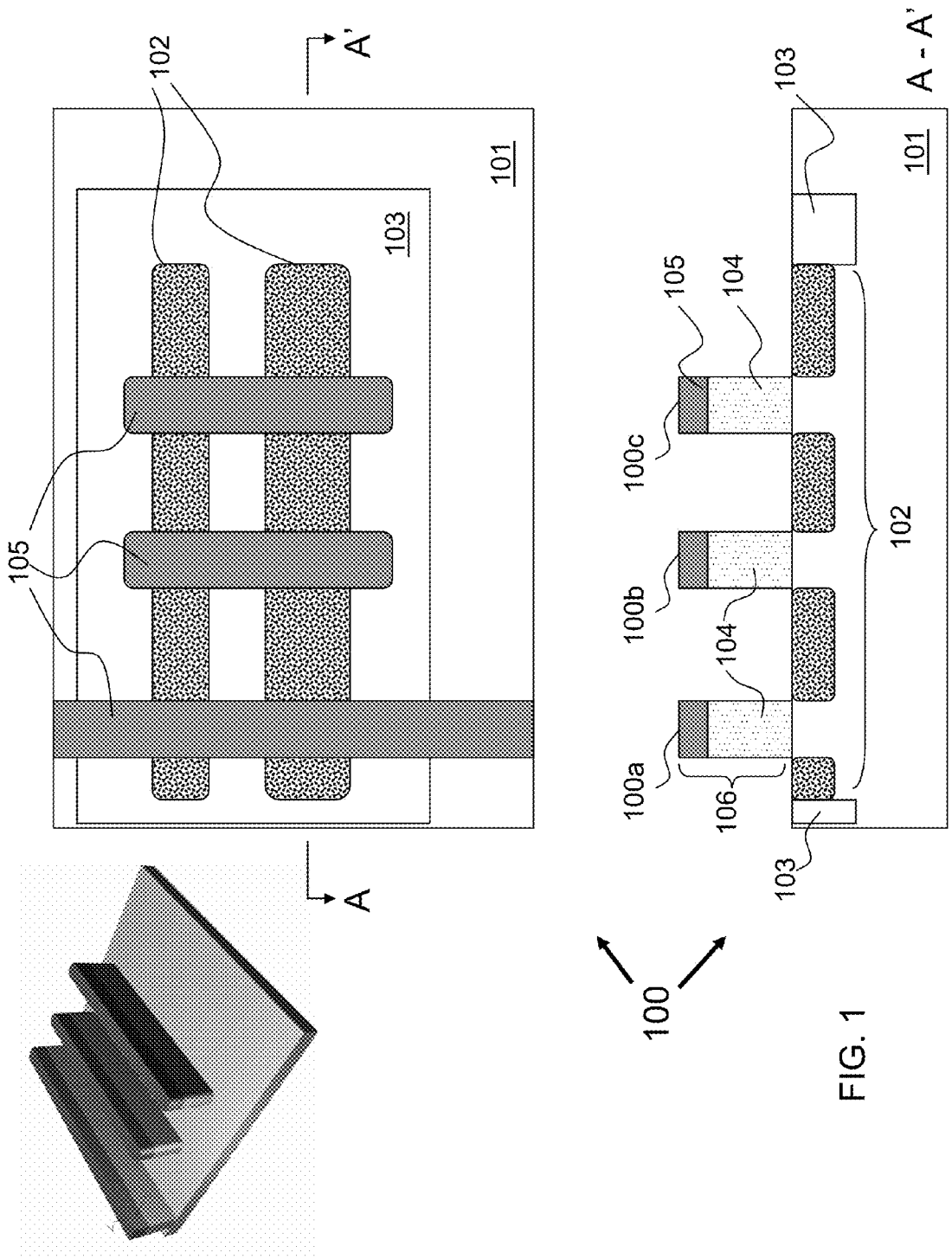
FIG. 1 is a demonstrative illustration of top and cross-sectional views of a semiconductor structure during a process of manufacturing thereof according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of top and cross-sectional views of a semiconductor structure during a process of manufacturing thereof according to an embodiment of the present invention. For better understanding and further comprehension, FIG. 1 also includes a perspective view of the semiconductor structure although references and related description, in the below detailed embodiment description, will be made only to the top and cross-sectional views of the structure. For the same intended purpose, other figures throughout this application may include perspective views of the semiconductor structure as well.

In order to make semiconductor structure 100 which may be, for example, a semiconductor chip or wafer or a part thereof, embodiment of the present invention provides a method of manufacturing that starts with a semiconductor substrate 101. The method includes forming one or more active silicon islands 102 in semiconductor substrate 101. Active silicon islands 102 may be formed for building field-effect-transistors (FET) thereupon, which generally include at least a channel region, and a source region and a drain region next to the channel region, and are formed to be isolated by one or more shallow-trench-isolation (STI) regions 103. Embodiment of the present invention may further include forming one or more gate electrodes, which may together form gate electrode lines 104, over the channel regions in active silicon islands 102 with a gate dielectric layer being disposed between gate electrode lines 104 and active silicon islands 102. Gate dielectric layer (not shown) may be comprised of silicon dioxide ($SiO_2$), HfO, $HfSiO_xN_y$, or other suitable material. Gate electrode lines 104 may be made of conductive materials such as, for example, metal and may be capped with a cap layer 105. Cap layer 105 may be made of dielectric material such as silicon nitride, for example $Si_3N_4$, or other proper insulating material and may be suitable to be used as a polish-stopping layer in a later stage as being discussed below in more details with reference to FIG. 3. In one embodiment, in order to increase selectivity during a spacer removal process as being discussed below with reference to FIG. 9, cap layer 105 may be preferably made from a both chemically and thermally stable material such as, for example, silicon-carbide SiC or silicon-carbon nitride SiCN that can withstand conditions of a standard nitride spacer removal process. Hereinafter, a gate electrode line 104 and a cap layer 105 on top thereof may be collectively referred to as a gate stack 106. As being illustrated in FIG. 1, semiconductor structure 100 may include one or more groups of FET such as FET group 100a, 100b, and 100c, and each group may share a same gate stack 106.

Figure 2:
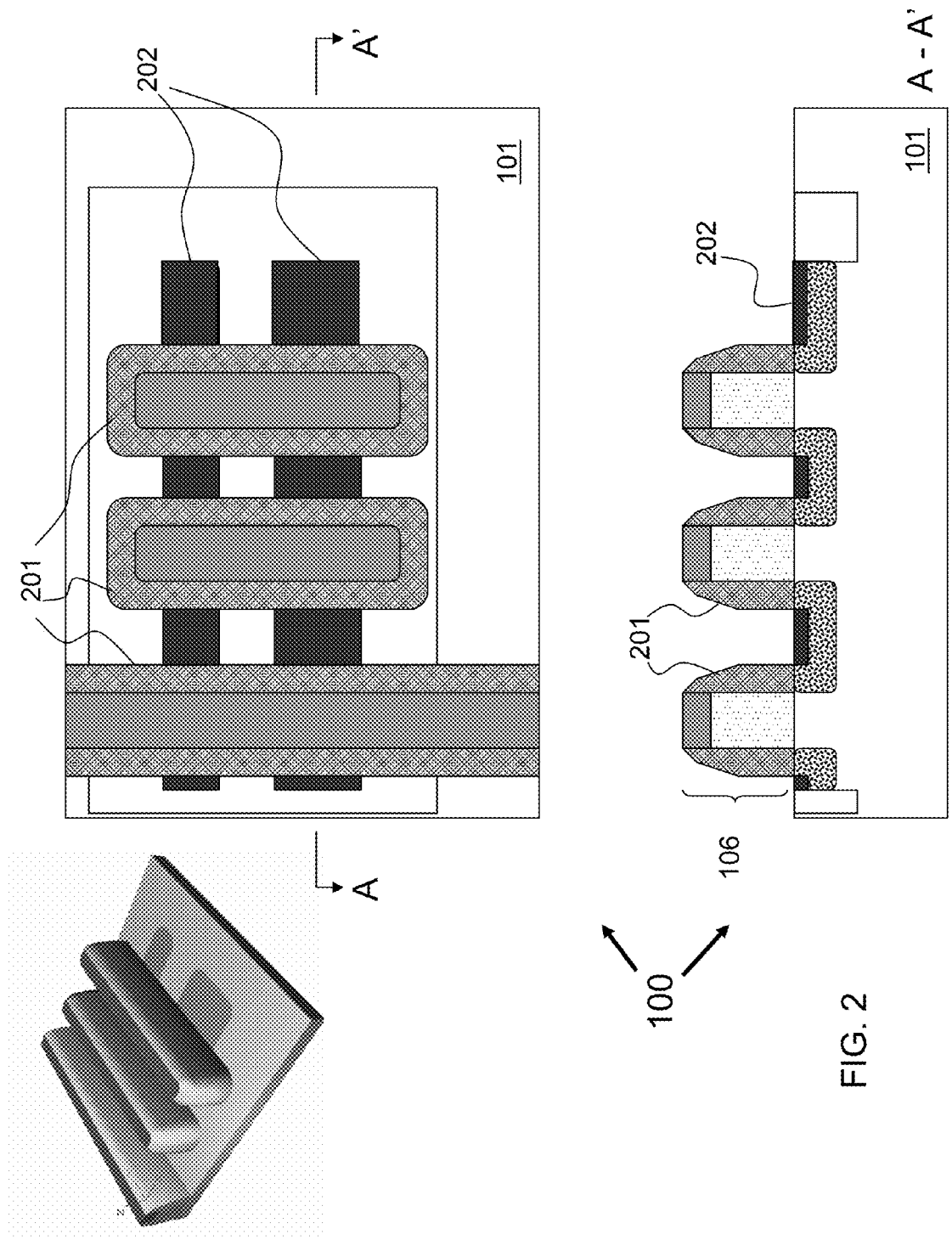
FIG. 2 is a demonstrative illustration of top and cross-sectional views of a semiconductor structure during a process of manufacturing thereof, following the step shown in FIG. 1, according to an embodiment of the present invention.

FIG. 2 is a demonstrative illustration of top and cross-sectional views of semiconductor structure 100 during a process of manufacturing thereof, following the step shown in FIG. 1, according to an embodiment of the present invention. Following the formation of gate stacks 106 as shown in FIG. 1, gate spacers 201 may be formed next to sidewalls of gate stacks 106 using standard front-end-of-line (FEOL) technologies as known in the art. Spacers 201 may be a single layer spacer or a multi-layer spacer having different layers of same or different materials. For example, spacers 201 may be made of layer(s) of nitride and/or oxide materials. As a result, gate electrode 104 may be encapsulated by dielectric cap layer 105 and insulating spacers 201. Separately and/or subsequently, source and drain regions of FET groups 100a, 100b, and 100c may be subjected to a salicidation process which forms silicide 202, such as nickel silicide, at a top surface of silicon islands 102. Silicide 202 improves conductivity of source and drain regions of FET groups 100a, 100b, and 100c.

After forming gate stacks 106 and surrounding gate spacers 201 as illustrated in FIG. 2, conventionally an insulating layer of pre-metal dielectric ("PMD") material may be deposited on top of substrate 101 to cover FET groups or devices 100a, 100b, and 100c. Subsequently, contact holes or local interconnect openings may be created inside the PMD layer and contacts or local interconnects may be formed by filling the holes or openings with metal or conductive materials. However, according to embodiments of the present invention, instead of forming an insulating PMD layer at this stage, a blanket conductive layer may be deposited on top of substrate 101 and FET devices 100a, 100b, and 100c at this stage with the blanket conductive layer containing suitable material for local interconnects.

Figure 3:
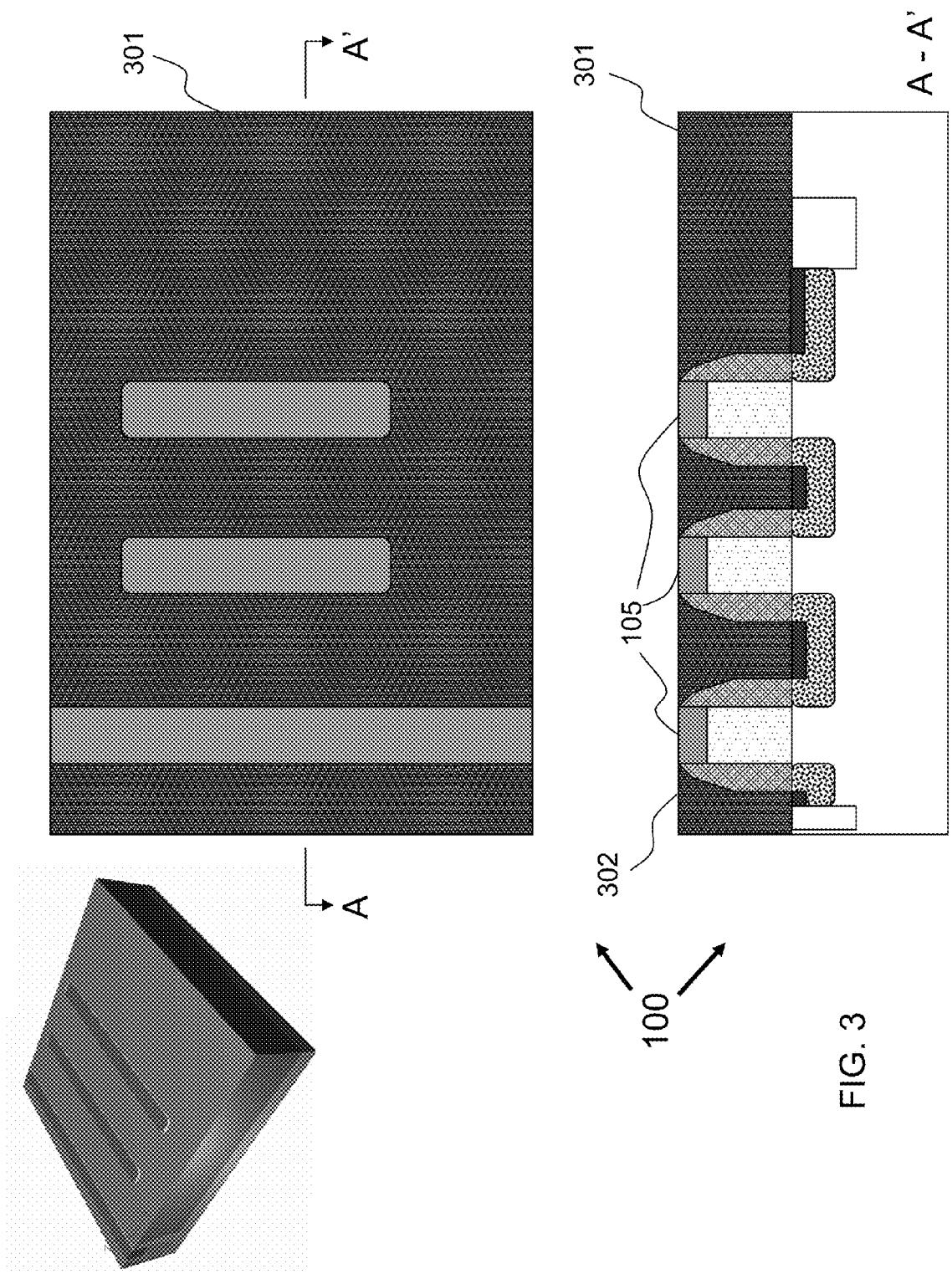
FIG. 3 is a demonstrative illustration of top and cross-sectional views of a semiconductor structure during a process of manufacturing thereof, following the step shown in FIG. 2, according to an embodiment of the present invention.

FIG. 3 is a demonstrative illustration of top and cross-sectional views of semiconductor structure 100 during a process of manufacturing thereof, following the step shown in FIG. 2, according to an embodiment of the present invention. More specifically, embodiment of the present invention includes depositing a blanket layer of conductive material 301 to cover most areas of semiconductor structure 100 including substrate 101 and FET devices 100a, 100b, and 100c. For example, blanket conductive layer 301 may cover at least areas where contacts and/or local interconnects are to be formed. In one embodiment, blanket conductive layer 301 may have a thickness such that it covers not only substrate 101 but also cap layer 105 that is on top of gate electrode line 104. In other words, the entire top surface of semiconductor structure 100 may be covered by blanket conductive layer 301.

Material of conductive layer 301 may include, for example, aluminum, nickel, copper, tungsten, or a combination thereof in a multi-layer form. For example, conductive layer 301 may be made of a layer of tungsten (W) on top of a thin aluminum (Al) layer lining the structure underneath. Structure of such a multi-layer form may facilitate a selective etching process of this conductive layer 301 as being described below in more details with reference to FIG. 4. Dependent upon the type of material being used for conductive layer 301, deposition of conductive layer 301 may be made through, for example, a plating process, a chemical vapor deposition process, a sputtering process, any other existing or future-developed processes, and/or a combination thereof.

Following the formation of blanket conductive layer 301, one embodiment of the present invention may include polishing a top surface of conductive layer 301 through, for example, a chemical-mechanic polishing (CMP) process to produce a flat top surface 302. During the CMP process, cap layer 105, made of silicon nitride for example as being described previously, may serve as a polish-stopping layer such that the CMP process stops when cap layers 105 on top of gate electrode lines 104 are exposed. Preferably, all the insulating cap layers 105 on top of gate electrode lines 104 are exposed through the CMP process and, in ensuring this, some level of erosion of insulating cap layers 105 may occur but such erosion is acceptable to a certain extent.

According to another embodiment of the present invention, after the formation of blanket conductive layer 301, photo-resist patterns that represent shapes of contacts and/or local interconnects may be formed directly on top of conductive layer 301 without exposing cap layer 105 through a CMP process, process of which is shown in more details later with references to FIGS. 11-13. In this embodiment, conductive layer 301, shown in FIG. 11 as conductive layer 1101, may have a top surface that is higher than the top surface of cap layer 105.

Figure 4:
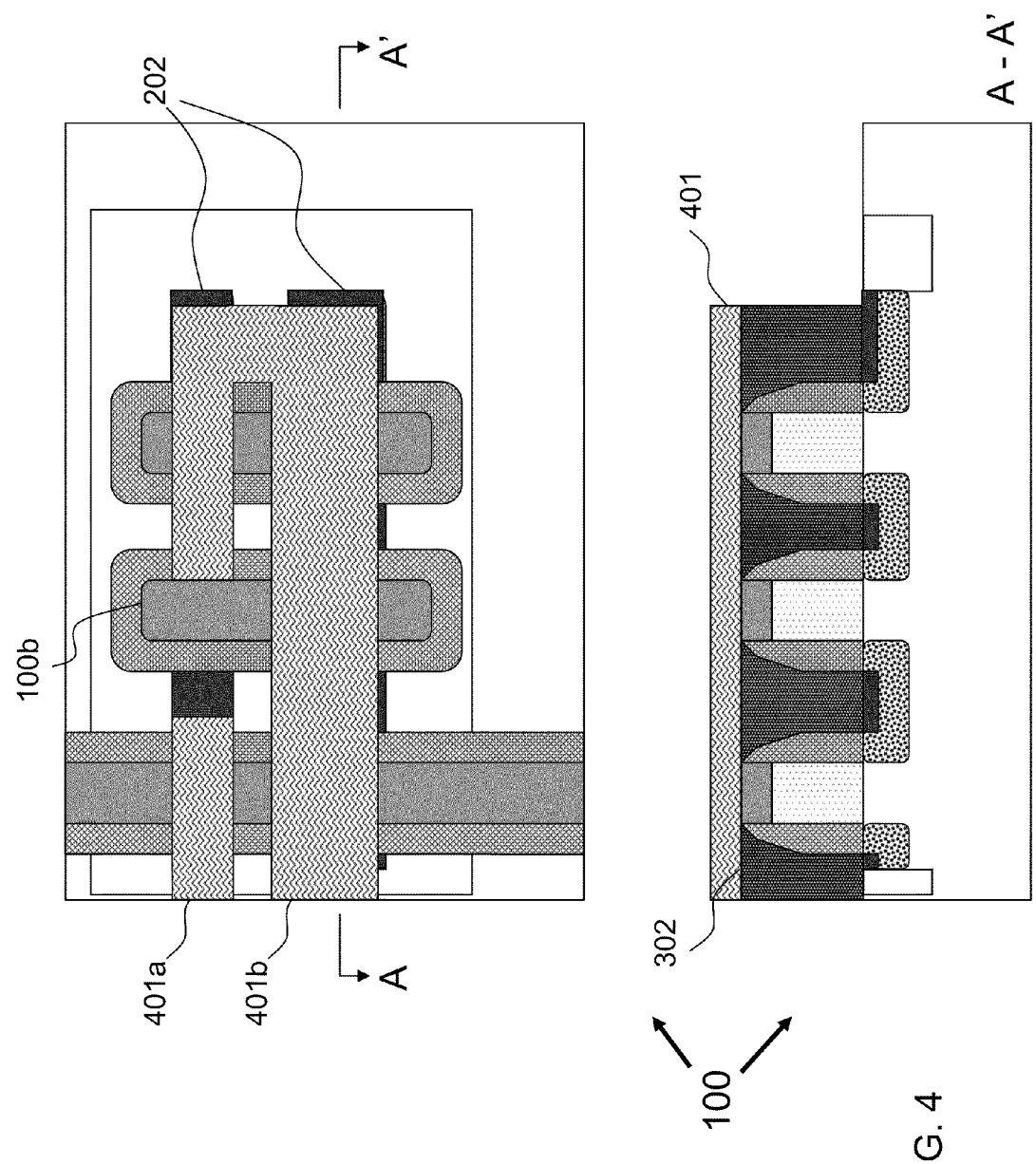
FIG. 4 is a demonstrative illustration of top and cross-sectional views of a semiconductor structure during a process of manufacturing thereof, following the step shown in FIG. 3, according to an embodiment of the present invention.

FIG. 4 is a demonstrative illustration of top and cross-sectional views of semiconductor structure 100 during a process of manufacturing thereof, following the step shown in FIG. 3, according to an embodiment of the present invention. For example, once all the insulating cap layers 105 are exposed, which are now surrounded by conductive layer 301 of local interconnect material, a photo-resist pattern 401, which represents shapes of contacts and/or local interconnects to be formed, may be formed on top of surface 302. Areas where no contacts and local interconnects are expected are not covered by photo-resist pattern 401 and left exposed.

For example, as a non-limiting example, photo-resist pattern 401 may include resist shape 401b for a borderless local interconnect and resist shape 401a for a partially-bordered local interconnect. Using photo-resist pattern 401 (including both 401a and 401b) as a protective mask, exposed portion of conductive layer 301 may be etched away. Preferably, etching of conductive layer 301 is made through a reactive-ion etching process (RIE), or any other suitable technique, that is selective to silicide 202 (FIG. 2), thereby causing minimal damage to affect conductivity of sources and drains of FET devices 100a, 100b, and 100c. For example, a combination of tungsten (W) and aluminum (Al) may be used as conductive layer 301. While tungsten (W) may be generally preferred as material for contacts or local interconnects for low resistance, a layer of aluminum (Al) underneath tungsten (W) may increase etching selectivity with regard to silicide 202, thereby reducing potential damage to silicide 202 due to over-etching when directly etching tungsten selective to silicide 202. In the meantime, in order to minimize increase in resistance of the local interconnect, a thin aluminum layer may be used.

In one embodiment, the etching process of conductive layer 301 may be made or designed through, for example, careful selection and adjustment of applied chemicals to be anisotropic thereby producing slopes that are within acceptable range. In addition, spacing between local interconnects and gate electrode lines may also be properly designed by adjusting, for example, a distance between photo-resist shape 401a and cap layer 105 of the center FET group 100b for the case shown in FIG. 4. In other instances, some local interconnects, for example local interconnect represented by resist shape 401b, may cross multiple silicon islands and be formed on top of isolators such as STI 103.

Figure 5:
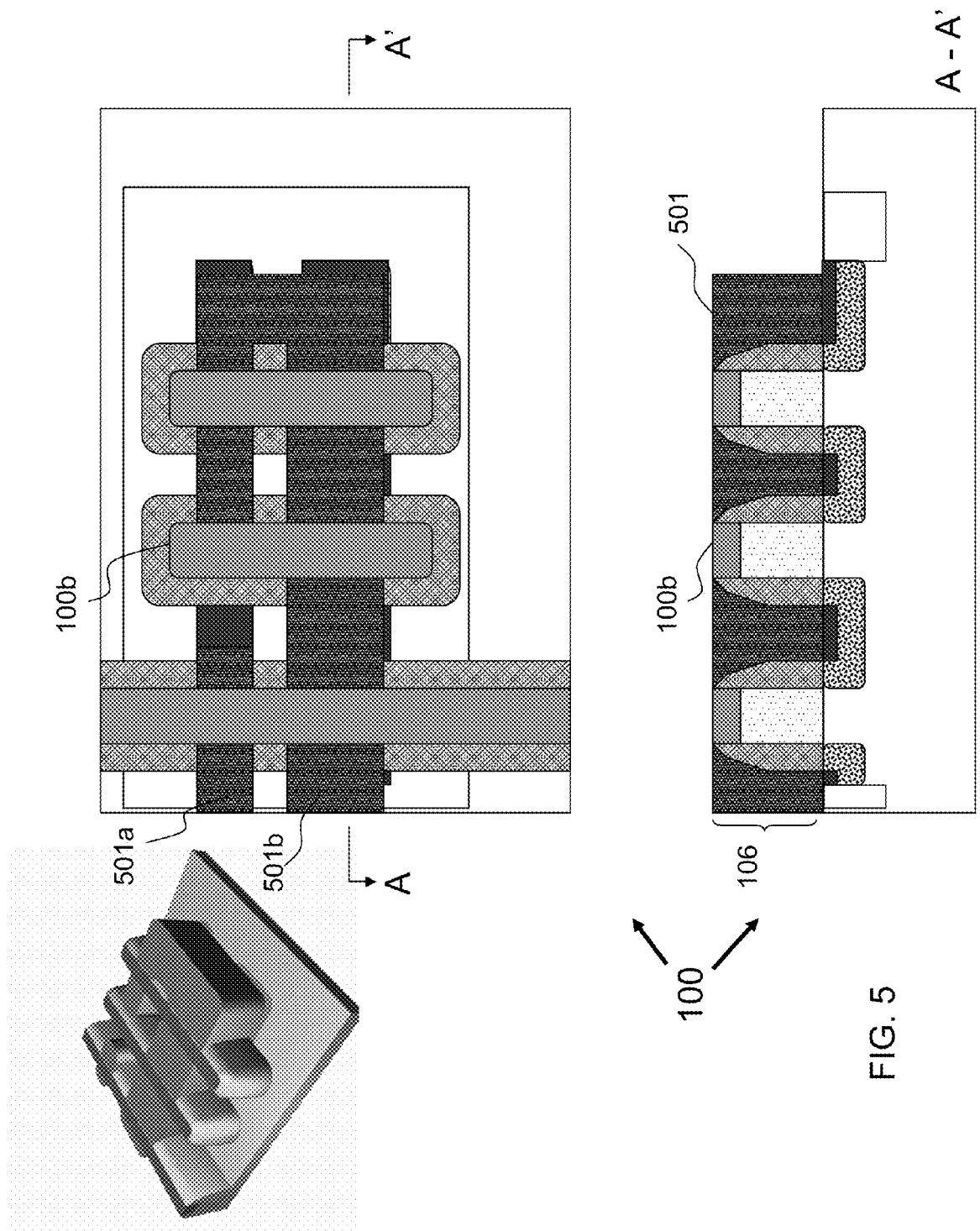
FIG. 5 is a demonstrative illustration of top and cross-sectional views of a semiconductor structure during a process of manufacturing thereof, following the step shown in FIG. 4, according to an embodiment of the present invention.

FIG. 5 is a demonstrative illustration of top and cross-sectional views of semiconductor structure 100 during a process of manufacturing thereof, following the step shown in FIG. 4, according to an embodiment of the present invention. After etching away exposed and un-protected conductive layer 301 through for example a RIE process, photo-resist pattern 401 may be lifted or removed using any well-known solvent, thereby exposing the underneath local interconnect structures 501a and 501b. More specifically, local interconnects 501b formed by resist pattern 401b may be borderless LIs having no border with gate stack 106 while local interconnect 501a formed by resist pattern 401a may be a partially-bordered LI which has a border with the gate stack 106 in the center FET, which is part of FET group 100b. Unlike any conventional way of forming local interconnect where contact holes need to be properly aligned with the underneath FET devices, local interconnect structures 501a and 501b formed according to embodiment of the present invention, as being described above, are self-aligned to the gate electrodes or electrode lines of underneath FET devices because they are directly deposited onto the devices, with material on top of the gate electrode being removed via a planarization process.

Figure 6:
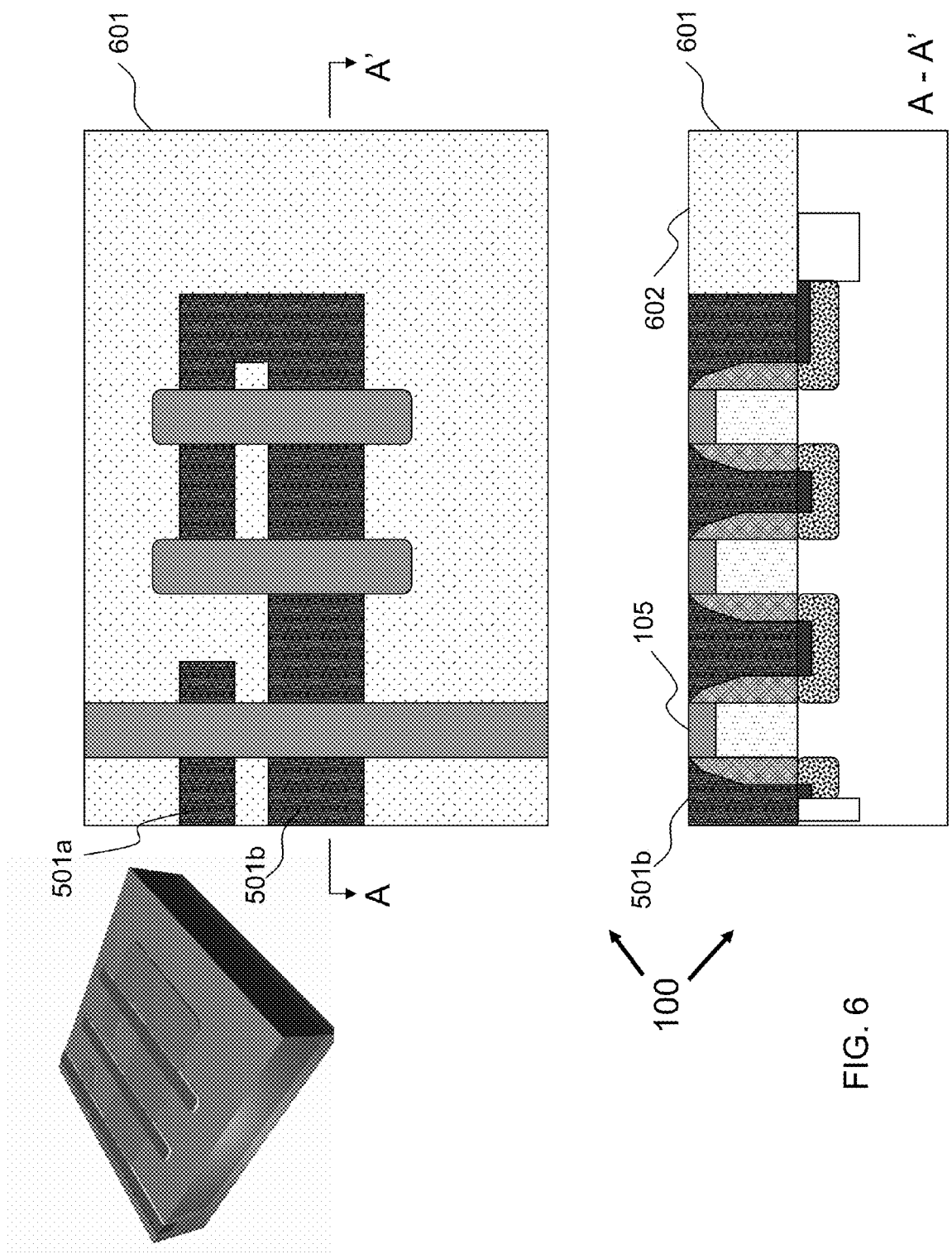
FIG. 6 is a demonstrative illustration of top and cross-sectional views of a semiconductor structure during a process of manufacturing thereof, following the step shown in FIG. 5, according to an embodiment of the present invention.

FIG. 6 is a demonstrative illustration of top and cross-sectional views of semiconductor structure 100 during a process of manufacturing thereof, following the step shown in FIG. 5, according to an embodiment of the present invention. After forming local interconnects 501a and 501b through removing un-protected conductive layer 301, embodiment of the present invention includes depositing a layer of insulating material 601 such as, for example, dielectric material to cover semiconductor substrate 101 as well as some or all of the structures and devices formed thereupon so far, including local interconnects 501a and 501b and cap layers 105. Subsequently, height of the insulating layer 601 may be lowered through polishing, strategically using cap layers 105 again as a polish-stopping layer. For example, through polishing, the height of insulating layer 601 may be lowered to have a surface 602 that is coplanar with cap layers 105 and top surface of local interconnects 501a and 501b.

Figure 7A:
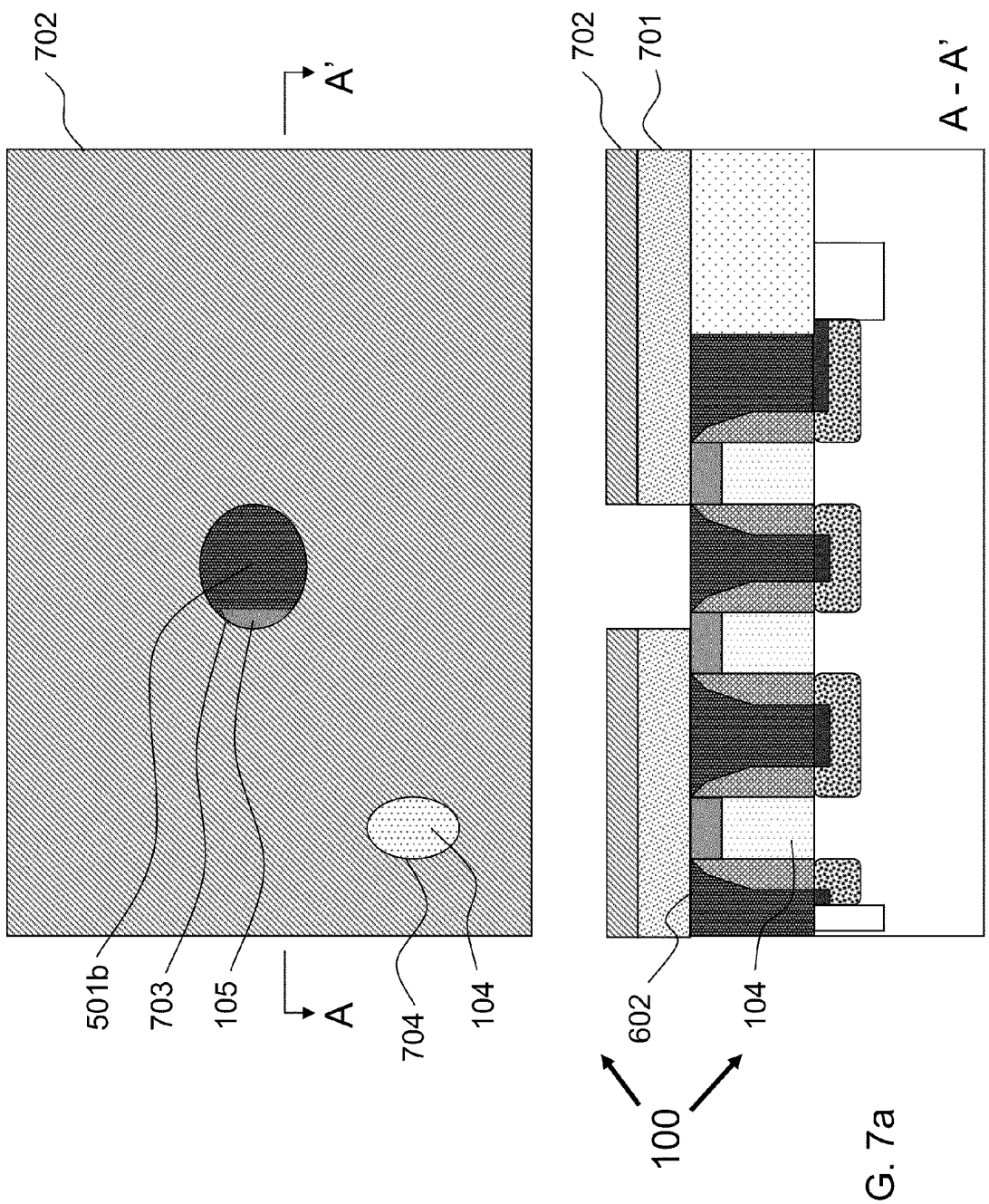
FIGS. 7a and 7b are demonstrative illustrations of top and cross-sectional views of a semiconductor structure during a process of manufacturing thereof, following the step shown in FIG. 6, according to an embodiment of the present invention.
Figure 7B:
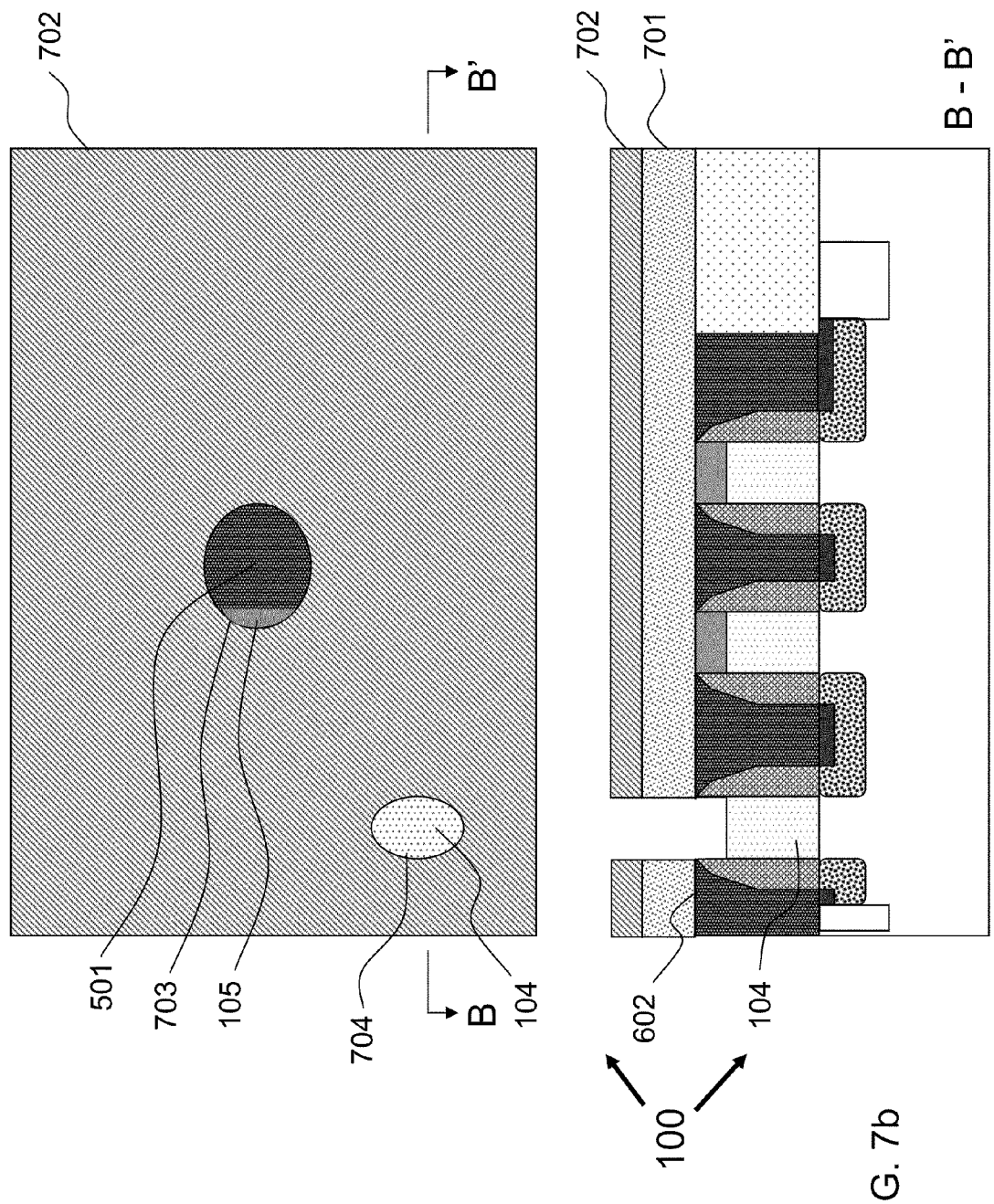

FIGS. 7a and 7b are demonstrative illustrations of top and cross-sectional views of semiconductor structure 100 during a process of manufacturing thereof, following the step shown in FIG. 6, according to an embodiment of the present invention. After insulating layer 601 is deposited and made coplanar with local interconnects 501a and 501b, metal contacts (or "vias") to gate electrode lines 104 and local interconnects 501a and 501b may be formed on top of the structure. For example, an interlayer dielectric film or layer ("ILD") 701 may first be formed on top of structure 100 following the step illustrated in FIG. 6. Subsequently, a conventional lithographic and etching process may be employed to create contact holes inside ILD layer 701. For example, a photo-resist layer 702 may first be coated on top of ILD layer 701. One or more contact holes may then be patterned in photo-resist layer 702 which are subsequently transferred, through etching, into underneath ILD layer 701.

As an example, one contact hole 703 may be made to expose local interconnect 501b (FIG. 7a) and another contact hole 704 may be made to expose gate electrode line 104 (FIG. 7b). In FIG. 7a, contact hole 703 is illustrated to be made directly in ILD layer 701 which exposes underneath local interconnect 501b. In some instances, contact hole 703 may adversely expose a portion of cap layer 105 due to misalignment as shown in FIG. 7a. Nevertheless, etching or damage to cap layer 105 may be avoided by carefully applying a proper selective etching process during the etching of ILD layer 701. As another example, as illustrated in FIG. 7b, contact hole 704 may be made by applying photo-resist pattern 702 as a protector to selectively remove both ILD layer 701 and insulating cap layer 105 which covers gate electrode line 104 at the location of FET group 100a. Depending upon the size of contact hole 704, some portion of spacers 201 may be exposed and etched as well. The etching may stop after gate electrode line 104 underneath cap layer 105 becomes exposed, possibly after certain level of over-etch of gate electrode line 104. In one embodiment, contact holes 703 and 704 may be made by applying two etching processes. For example, one mask may be used to etch both contact holes 703 and 704 up to exposing cap layer 105. Then, a different mask maybe used to re-expose only contact hole 704 and continue etching cap layer 105 at the bottom to expose gate electrode 104 to complete etching of contact hole 704.

Figure 8A:
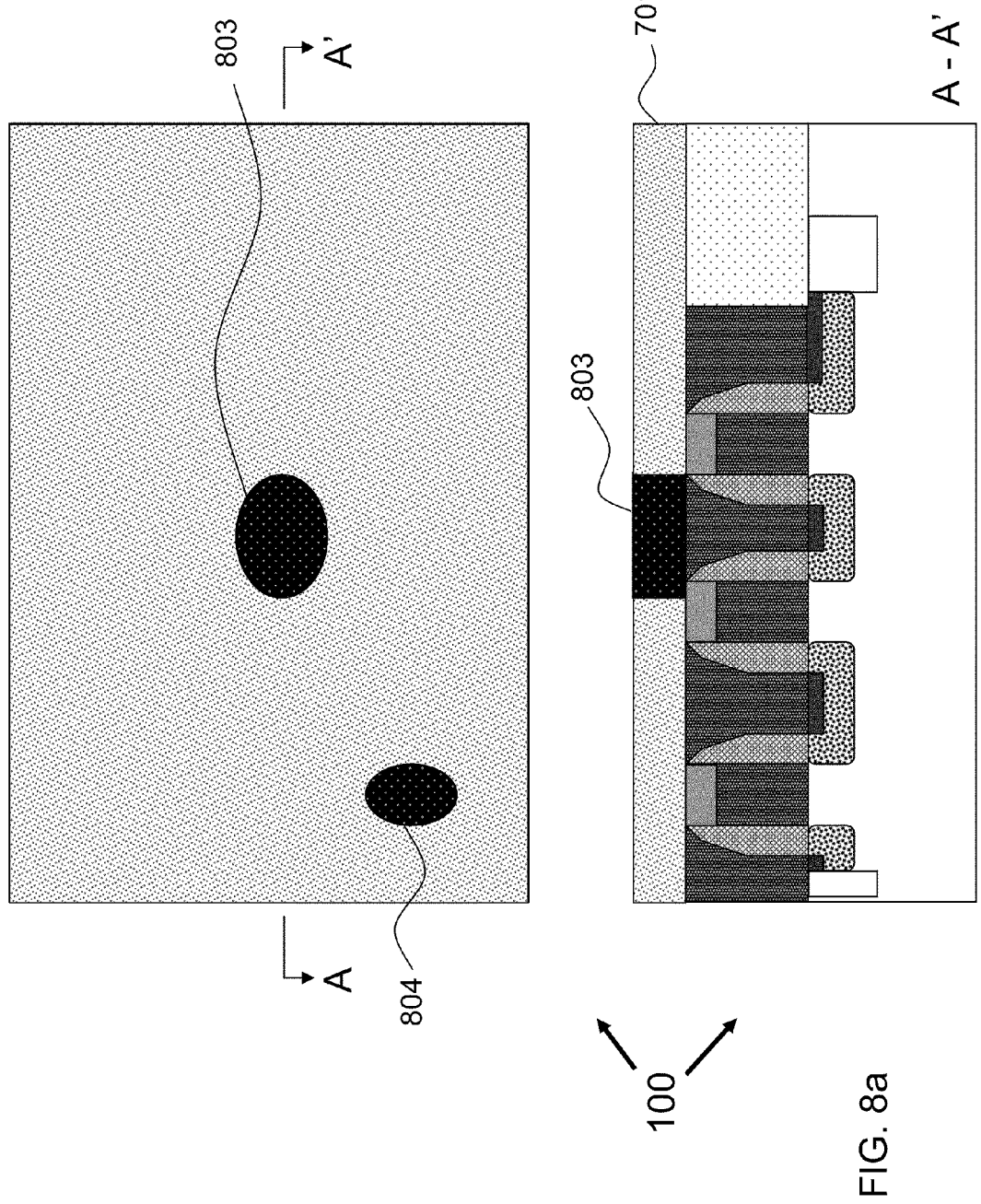
FIGS. 8a and 8b are demonstrative illustrations of top and cross-sectional views of a semiconductor structure during a process of manufacturing thereof, following the step shown in FIG. 7, according to an embodiment of the present invention.
Figure 8B:
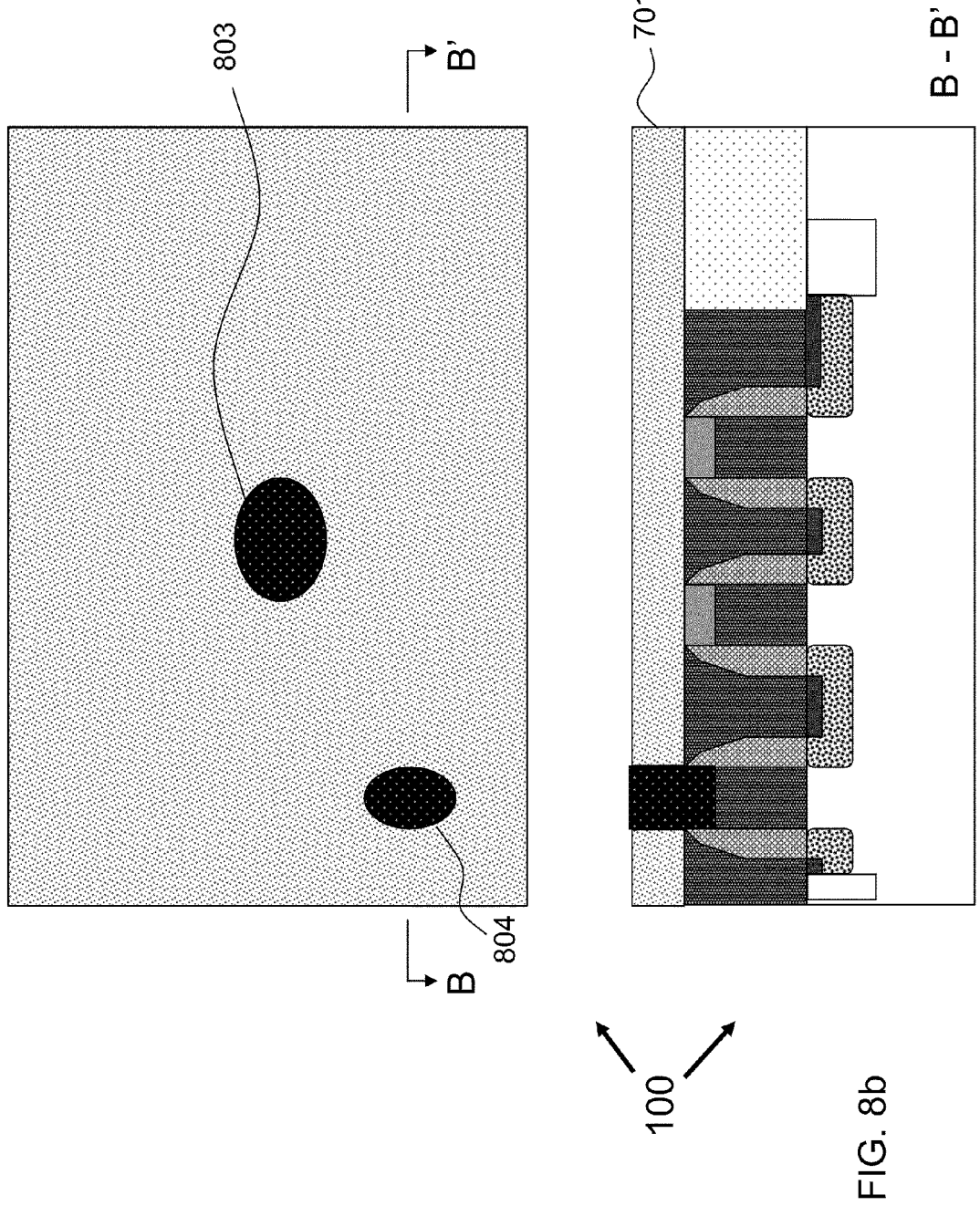

FIGS. 8a and 8b are demonstrative illustrations of top and cross-sectional views of semiconductor structure 100 during a process of manufacturing thereof, following the step shown in FIGS. 7a and 7b, according to an embodiment of the present invention. For example, after forming ILD layer 701 and performing selective etching in areas exposed by photo-resist pattern 702, and removal of photo-resist pattern 702, conductive material such as copper, nickel, tungsten, or any other suitable material may be deposited into openings made inside ILD layer 701 to form metal contacts. More specifically, for example, metal contact 803 may be formed to be in contact with local interconnect 501b between FET group 100b and FET group 100c (FIG. 8a), and metal contact 804 may be formed to be in contact with gate electrode line 104 of FET group 100a (FIG. 8b).

Alternatively, in accordance with another embodiment of the present invention, after forming semiconductor structure 100 shown in FIG. 5, steps may be taken in the process to produce additional features of semiconductor structure 100 such as features that will lower capacitance of the FETs.

Figure 9:
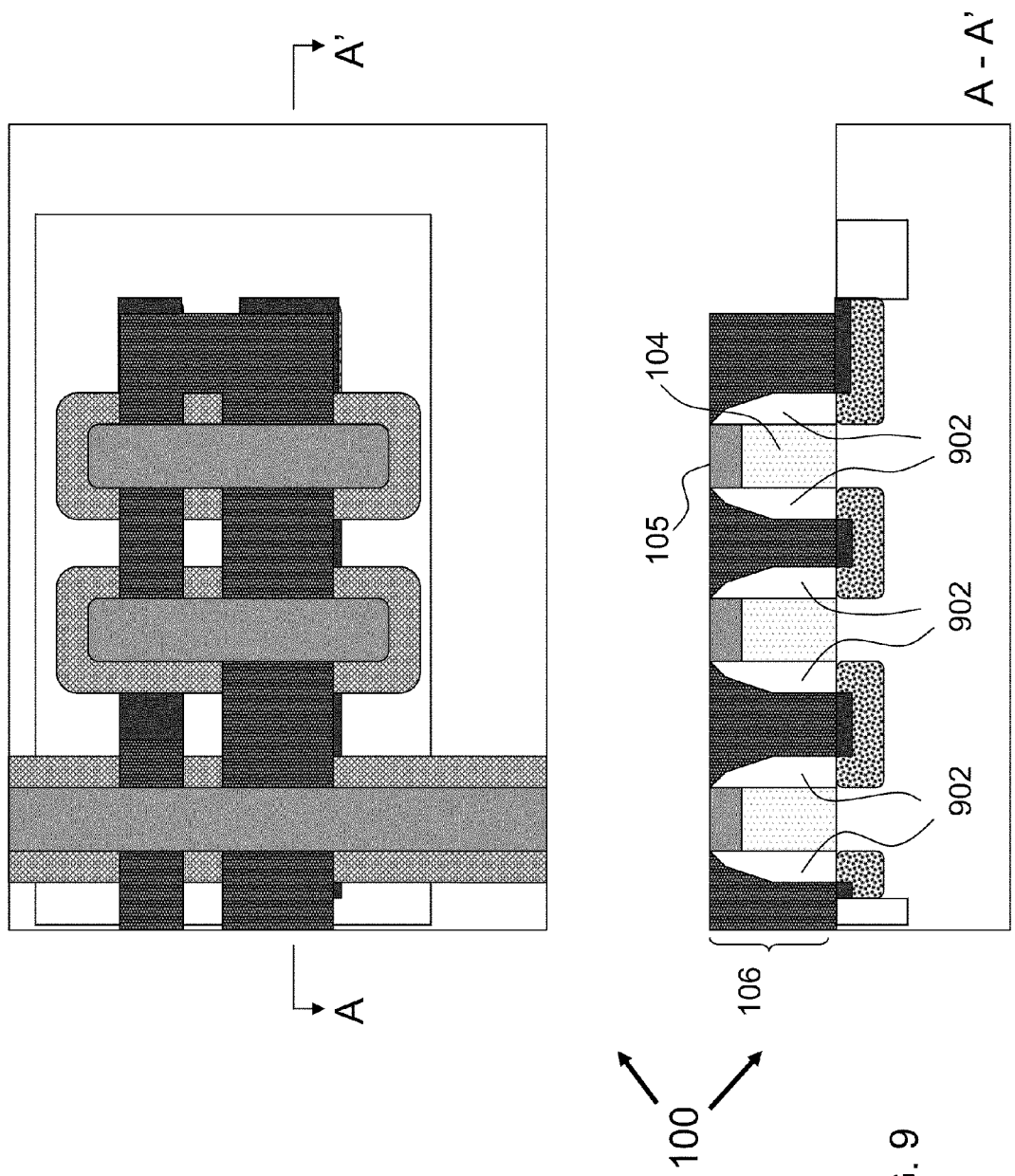
FIG. 9 is a demonstrative illustration of top and cross-sectional views of a semiconductor structure during a process of manufacturing thereof, following the step shown in FIG. 5, according to an embodiment of the present invention.

FIG. 9 is a demonstrative illustration of top and cross-sectional views of semiconductor structure 100 during a process of manufacturing thereof, following the step shown in FIG. 5, according to an embodiment of the present invention. More specifically, after forming local interconnects 501a and 501b as shown in FIG. 5, gate spacers 201 next to gate stacks 106 may be partially or completely removed through a selective removing process to create air gaps 902 between gate stacks 106 and local interconnects 501a and/or 501b. Generally, because air has a lower dielectric constant compared with material of spacers such as nitride, by replacing spacers 201 at least partially with air, semiconductor device 100 will have reduced parasitic capacitance between gate electrode line 104 and local interconnect 501.

In this embodiment, during foregoing formation of gate spacers 201 as illustrated in FIG. 2, material for spacers 201 may be properly selected in such a way as to facilitate the selective removal process at this stage. The removal of spacers 201 may be performed through a selective and isotropic etching process. Following is a table of four possible combinations and corresponding chemicals that may be used for the removal of spacers according to some embodiments of the present invention. A person skilled in the art will appreciate that embodiments of present invention are not limited in this aspect and other combinations of materials and chemicals may be used as well, in forming air gaps between gate stack and local interconnects. In the table, "Offset Spacer" is a spacer (not shown in the drawings) which in some embodiment may underlay spacer material (such as 201 in FIG. 2) and protect the gate from "spacer strip" chemicals. A notation like "$SiO_2$-on-$Si_3N_4$" denotes a composite, layered, structure.

TABLE 1

List of combination of material for removal of spacers.

|  | I | II | III | IV |
|---|---|---|---|---|
| STI | $SiO_2$ | $SiO_2$ | $SiO_2$ | $SiO_2$ |
| LI | W | W | W | Ta |
| Spacers | DLC* | $SiO_2$* | $Ge(O_2)$* | $Si_3N_4$ |
| Offset Spacer | $Si_3N_4$ | $Si_3N_4$ | $Si_3N_4$ | $SiO_2$-on-$Si_3N_4$ |
| Cap | $Si_3N_4$ | $Si_3N_4$ | $Si_3N_4$ | $Si_3N_4$-on-$SiO_2$ |
| Spacer Strip | $O_2$ plasma | HF | Water/$H_2O_2$ | Hot Phosphoric Acid |

According to one embodiment of the present invention, with the proper selection of material for cap layer 105, cap layer 105 may remain substantially un-eroded during the removal process of spacers 201 as shown in FIG. 9. Gate electrode lines 104 may remain substantially un-eroded as well by careful selection of the spacer removal process and conditions associated therewith. Alternatively, spacers 201 may be made of multiple layers of different materials in previous steps, and the spacer removal process may remove only a portion of the spacers through increased selectivity of etching provided by the combination of spacer materials.

Figure 10:
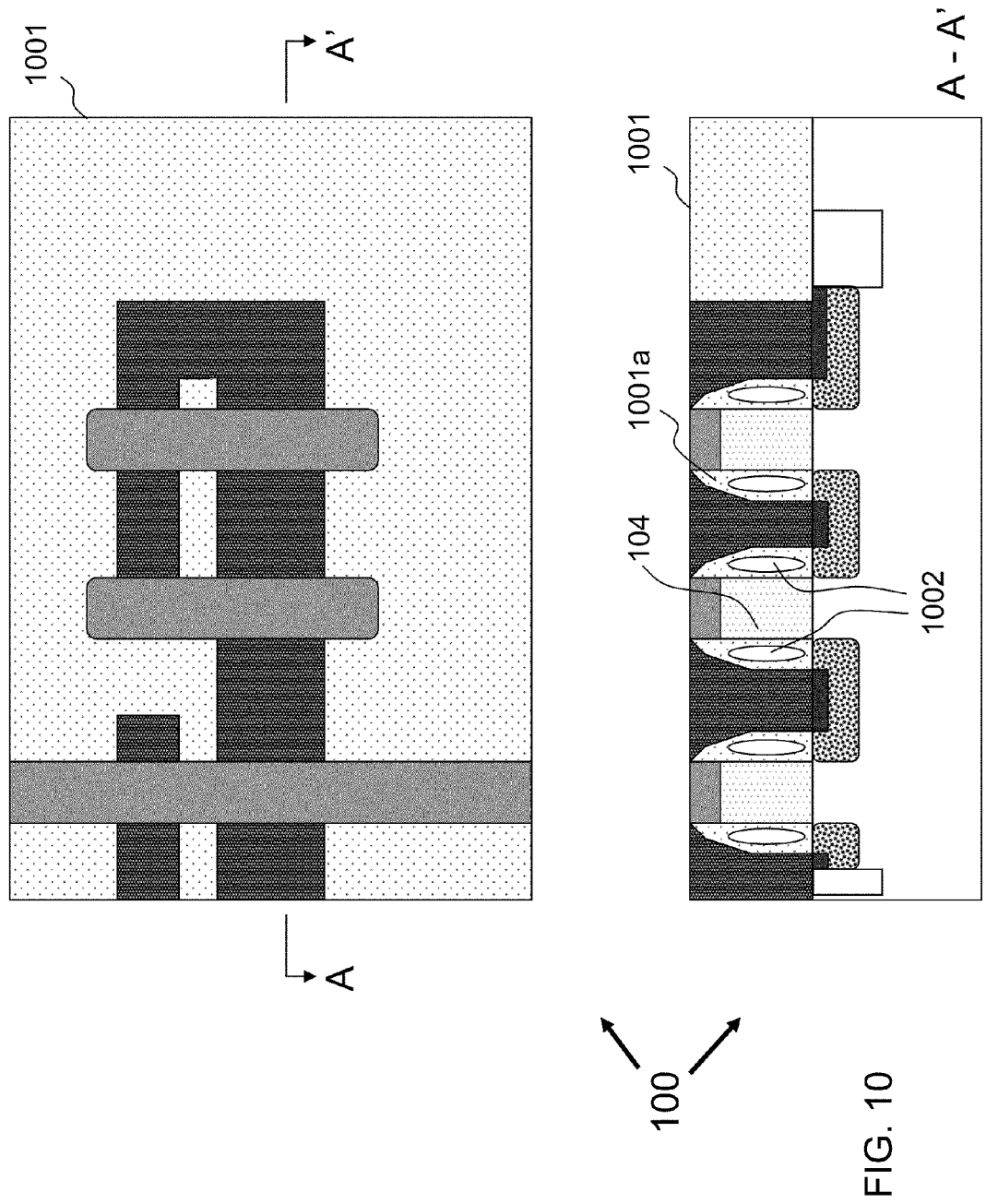
FIG. 10 is a demonstrative illustration of top and cross-sectional views of a semiconductor structure during a process of manufacturing thereof, following the step shown in FIG. 9, according to an embodiment of the present invention.

FIG. 10 is a demonstrative illustration of top and cross-sectional views of semiconductor structure 100 during a process of manufacturing thereof, following the step shown in FIG. 9, according to an embodiment of the present invention. Following the removal of spacers 201, embodiment of the present invention may include depositing a layer of insulating material 1001 such as dielectric material to cover substrate 101 and local interconnects 501a and 501b of semiconductor structure 100, similar to the step shown in FIG. 6. Insulating material 1001 may be selected such that it is sufficiently non-conformal thereby leaving at least some air gaps between gate electrode line 104 (or gate stack 106) and local interconnect structures 501a and/or 501b during the deposition to form a tunnel 1002 by the air gaps. After the deposition of insulating material 1001, steps similar to those shown in FIGS. 7 and 8 may follow to finish forming contacts to local interconnects 501a and 501b.

Figure 11:
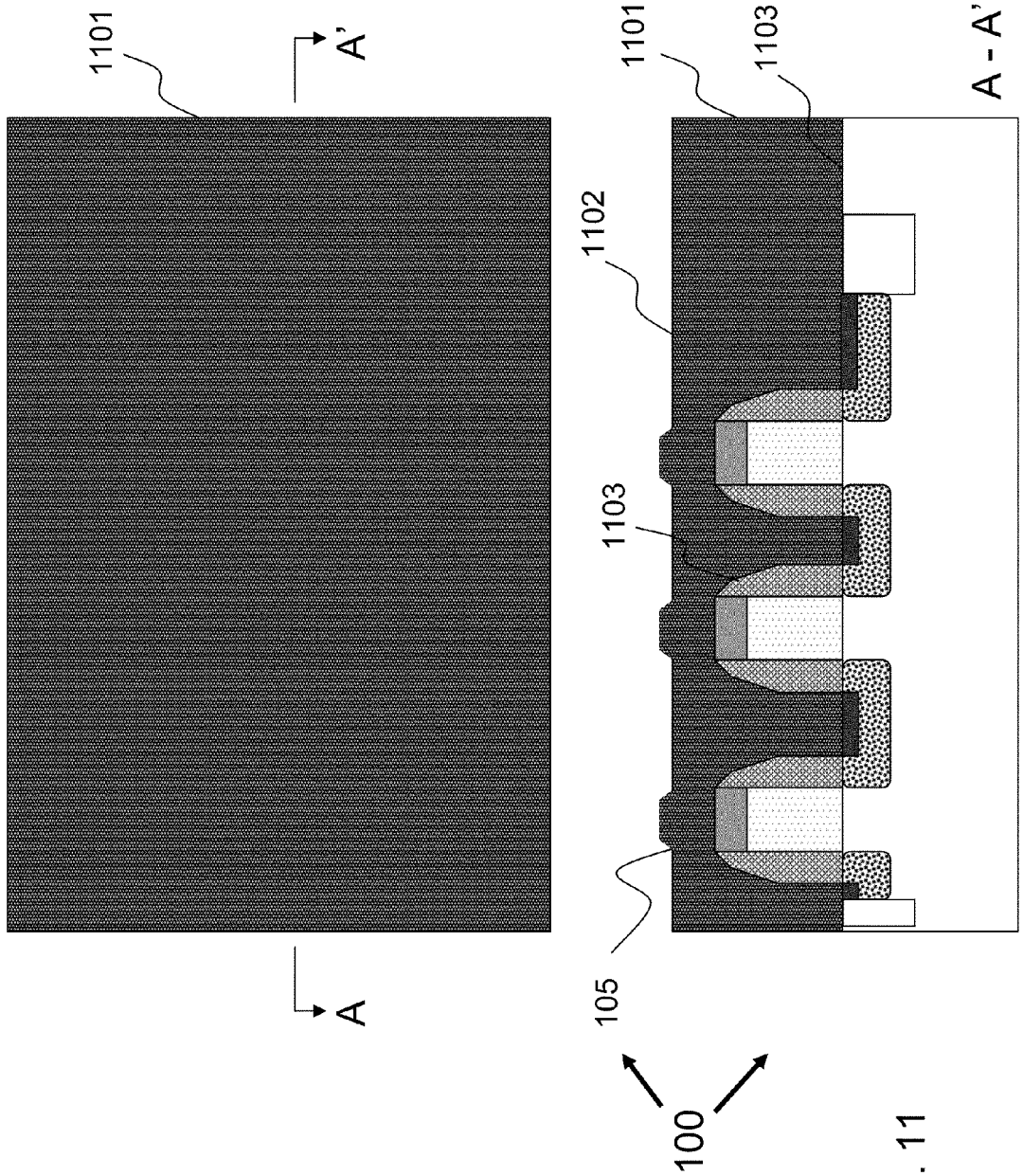
FIG. 11 is a demonstrative illustration of top and cross-sectional views of a semiconductor structure during a process of manufacturing thereof, following the step shown in FIG. 2, according to an embodiment of the present invention.

FIG. 11 is a demonstrative illustration of top and cross-sectional views of a semiconductor structure during a process of manufacturing thereof, following the step shown in FIG. 2, according to an embodiment of the present invention. Conductive layer 1101 may be blanket deposited on top of semiconductor structure 100 including substrate 101 and FET groups or devices 100a, 100b, and 100c. Top surface 1102 of conductive layer 1101, which is higher than and covers cap layer 105, may not be flat and may show topography of FET groups 100a, 100b, and 100c underneath. The topography facilitates a positioning process in a next step of forming photo-lithographic pattern for contacts and/or local interconnects. In situations where top surface 1102 of conductive layer 1101 is flat or is made flat, with cap layer 105 being covered by conductive layer 1101, other marking or positioning techniques known in the art may be used in the next photo-lithographic patterning process.

In one embodiment, before the deposition of conductive layer 1101, an etch-stop layer 1103 may first be deposited on top of semiconductor structure 100 including substrate 101 and FET groups or devices 100a, 100b, and 100c. For example, an $HfO_2$ layer, or any other suitable material with high etch-selectivity relative to conductive layer 110, may be formed as etch-stop layer 1103. The method may then pattern etch-stop layer 1103 to selectively expose silicide in the source and drain regions of FET groups 100a, 100b, and 100c by removing etch-stop layer 1103 on top thereof. Conductive layer 1101 may subsequently be blanket deposited on top of semiconductor structure 100 via etch-stop layer 1103. Conductive layer 1101 is made in contact with silicide in the source and drain regions of FET devices 100a, 100b, and 100c. On the other hand, the use of etch-stop layer 1103 facilitates the formation of local interconnects during a subsequent step of etching conductive layer 1101 through increased etch-selectivity.

Figure 12:
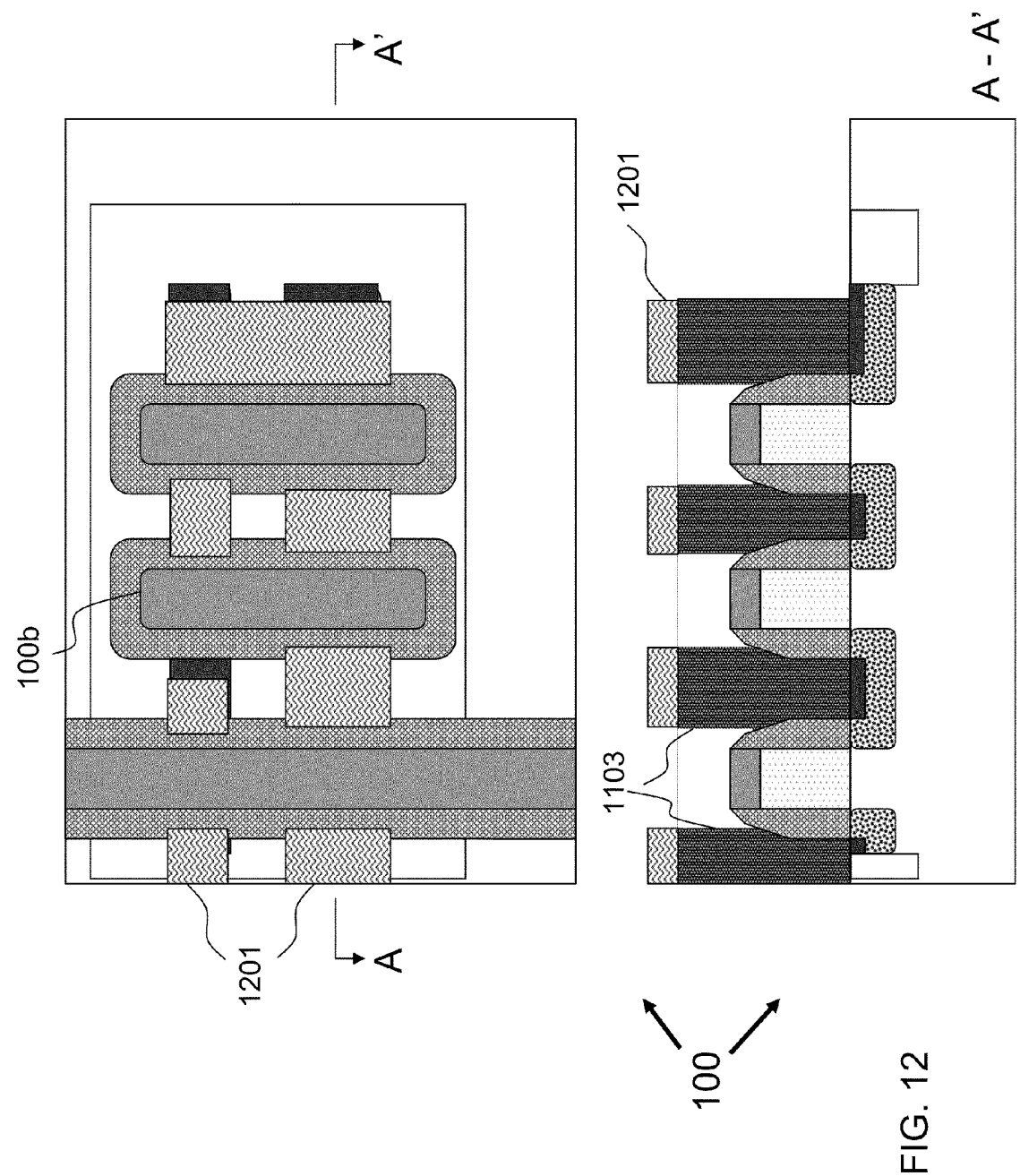
FIG. 12 is a demonstrative illustration of top and cross-sectional views of a semiconductor structure during a process of manufacturing thereof, following the step shown in FIG. 11, according to an embodiment of the present invention.

FIG. 12 is a demonstrative illustration of top and cross-sectional views of a semiconductor structure during a process of manufacturing thereof, following the step shown in FIG. 11, according to an embodiment of the present invention. For example, a photo-resist pattern 1201 may be formed which represent shapes of contacts and/or local interconnects to be formed out of conductive layer 1101. In this embodiment, photo-resist pattern 1201 is made different from photo-resist pattern 401, shown in FIG. 3, in order to etch away, for example, portions of conductive layer 1101 that are on top of cap layer 105. The formation of photo-resist pattern 1201 is subsequently followed by the etching of conductive layer 1101 to produce contacts and/or local interconnect 1103 as illustrated in FIG. 12. Contacts and/or local interconnects 1103 may have a height above the top surface of cap layer 105 which may be advantageous in forming some additional interconnects, for example, between/among the local interconnects (not shown).

Figure 13:
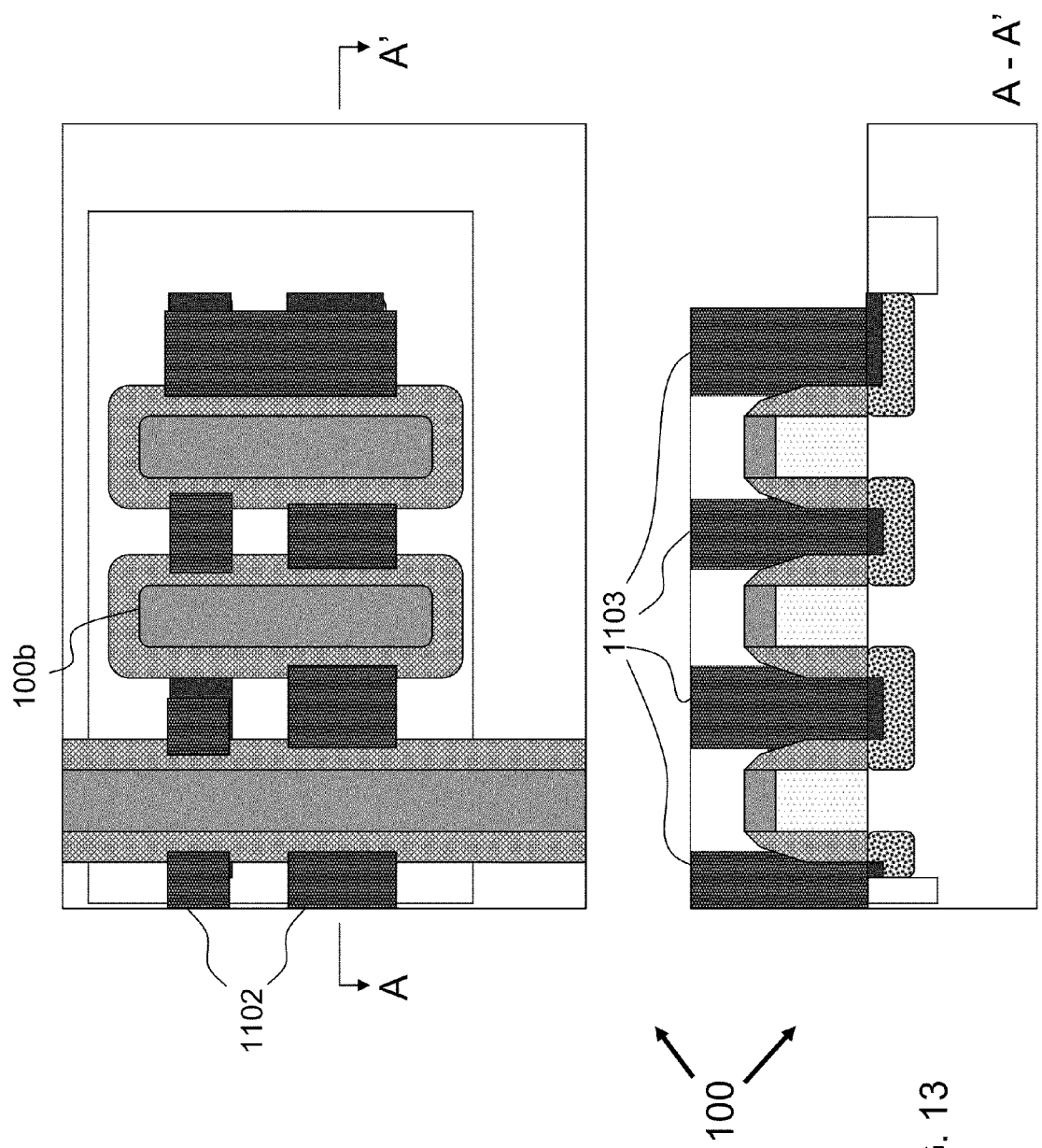
FIG. 13 is a demonstrative illustration of top and cross-sectional views of a semiconductor structure during a process of manufacturing thereof, following the step shown in FIG. 12, according to an embodiment of the present invention.

FIG. 13 is a demonstrative illustration of top and cross-sectional views of a semiconductor structure during a process of manufacturing thereof, following the step shown in FIG. 12, according to an embodiment of the present invention. More specifically, FIG. 13 illustrates contacts and/or local interconnects 1103 after photo-resist pattern 1201 is removed or lifted. Thereafter, steps similar to those illustrated in FIG. 6 (or FIG. 9) and subsequent steps similar to those illustrated in FIG. 7a/FIG. 7b and/or FIG. 8a/FIG. 8b may be performed to add additional features and/or metal contacts.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   depositing a blanket layer of conductive material over one or more semiconductor devices, said semiconductor devices containing conductive gate structures being encapsulated by a dielectric cap layer and insulating spacers;
   planarizing said layer of conductive material to expose said dielectric cap on the encapsulated gate structures;
   creating a pattern of local interconnect covering a portion of said planarized layer of conductive material;
   removing rest of said planarized layer of conductive material that is not covered by said pattern of local interconnect; and
   forming local interconnect by said portion of said planarized layer of conductive material, said local interconnect connecting said one or more semiconductor devices.

2. The method of claim 1, wherein said semiconductor devices are field-effect-transistors having source/drain regions adjacent to said spacers, further comprising forming silicide in said source/drain regions, of at least one of said one or more field-effect-transistors.

3. The method of claim 1, wherein said blanket layer of conductive material comprises a layer of first conductive material being formed directly on top of a layer of second conductive material, said first conductive material being different from second conductive material.

4. The method of claim 2, wherein depositing said blanket layer of conductive material comprises depositing said blanket layer of conductive material directly on top of said spacers and silicide in said source/drain regions of said at least one of said one or more field-effect-transistors.

5. The method of claim 2, wherein creating said pattern of local interconnect comprises forming said pattern of local interconnect, in position relative to said cap layer, in a photo-resist material through a photo-lithographic process.

6. The method of claim 2, further comprising removing said spacers of said one or more field-effect-transistors after forming said local interconnect, thereby creating openings between said local interconnect and said gate electrodes.

7. The method of claim 3, wherein said first conductive material has at least equal or better conductivity than said second conductive material.

8. The method of claim 3, wherein said first conductive material is tungsten (W), aluminum (Al), or nickel (Ni) and said second conductive material is aluminum (Al), tungsten (W), tantalum (Ta), or titanium-aluminum alloys, said layer of second conductive material lining said one or more semiconductor devices.

9. The method of claim 3, wherein removing said rest of said blanket layer of conductive material comprises applying a first selective etching process to remove said first conductive material and a second selective etching process to remove said second conductive material, said second selective etching process has a better selectivity, relative to said one or more semiconductor devices, than said first selective etching process.

10. The method of claim 6, further comprising depositing a dielectric layer covering said local interconnect, wherein depositing said dielectric layer fills only partially said openings between said local interconnect and said gate electrodes and does not close said openings.

11. The method of claim 10, further comprising planarizing said dielectric layer and forming at least one metal contact on top thereof, wherein said at least one metal contact being in contact with said local interconnect.

12. A method comprising:
  depositing a blanket layer of conductive material over one or more field-effect-transistors;
  creating a photo-resist pattern of local interconnect covering a portion of said blanket layer of conductive material;
  forming one or more local interconnects of said conductive material by removing portion of said blanket layer of conductive material that is not covered by said photo-resist pattern of local interconnect; and
  connecting said one or more field-effect-transistors by said one or more local interconnects.

13. The method of claim 12, wherein said one or more field-effect-transistors include source/drain regions, gate electrode, and spacers adjacent to said gate electrode; and wherein depositing said blanket layer of conductive material comprises depositing said blanket layer of conductive material directly on top of said spacers and silicide in said source/drain regions of said one or more field-effect-transistors.

14. The method of claim 12, wherein said blanket layer of conductive material comprises a layer of first conductive material being formed directly on top of a layer of second conductive material, said first conductive material being different from second conductive material.

15. The method of claim 13, wherein said one or more field-effect-transistors include a cap layer on top of said gate electrode, further comprising, before forming said photo-resist pattern of local interconnect, polishing said blanket layer of conductive material until said cap layer is exposed.

16. The method of claim 13, further comprising removing said spacers of said one or more field-effect-transistors after forming said local interconnect, creating openings between said local interconnect and said gate electrodes.

17. The method of claim 14, wherein said first conductive material is tungsten (W) and said second conductive material is aluminum (Al), and said layer of second conductive material lining said one or more field-effect-transistors.

18. The method of claim 14, wherein removing said blanket layer of conductive material comprises applying first and second selective etching processes, respectively, to remove said first and second conductive materials, wherein said second selective etching process has a better selectivity, than said first etching process, to silicide in said source/drain regions of said one or more field-effect-transistors.

19. The method of claim 16, further comprising depositing a dielectric layer covering said local interconnect, wherein depositing said dielectric layer, to the most, fills partially said openings between said local interconnect and said gate electrodes and does not close entirely said openings between said gate electrode and said local interconnect.

20. A method comprising:
  depositing a blanket layer of conductive material over one or more field-effect-transistors, said one or more field-effect-transistors having source/drain regions next to a channel region, a gate electrode on top of said channel region, spacers adjacent to said gate electrode, and an insulating cap layer on top of said gate electrode;
  creating a pattern of local interconnect in a photo-resist layer on top of said blanket layer of conductive material;
  removing a portion of said blanket layer of conductive material that is not covered by said pattern of local interconnect thereby forming one or more local interconnects of said conductive material; and
  connecting said one or more field-effect-transistors by said one or more local interconnects.

21. The method of claim 20, wherein depositing said blanket layer of conductive material comprises depositing said blanket layer of conductive material directly on top of said spacers and silicide in said source/drain regions of said one or more field-effect-transistors.

22. The method of claim 20, further comprising, before forming said pattern of local interconnect, polishing said blanket layer of conductive material until said insulating cap layer is exposed.

23. The method of claim 20, wherein said blanket layer of conductive material comprises a layer of first conductive material being formed directly on top of a layer of second conductive material, said first conductive material being different from, and having at least equal or less resistance than, said second conductive material.

24. The method of claim 20, wherein said blanket layer of conductive material is formed on top of an insulating etch-stop layer being deposited on top of said spacers and on top of silicide in said source/drain regions of said one or more field-effect transistors, and wherein said insulating etch-stop layer is patterned to expose said source/drain regions of said one or more field-effect-transistors prior to said formation of said blanket layer of conductive material.

25. The method of claim 24, wherein said insulating etch-stop layer is a layer of $HfO_2$.

* * * * *